United States Patent [19]

Villani

[11] Patent Number: 4,772,872
[45] Date of Patent: Sep. 20, 1988

[54] ALIGNMENT SYSTEM FOR ENCODERS
[75] Inventor: Daniel D. Villani, Long Beach, Calif.
[73] Assignee: Hughes Aircraft Company, Los Angeles, Calif.
[21] Appl. No.: 940,885
[22] Filed: Dec. 12, 1986
[51] Int. Cl.⁴ .............................................. H03M 1/26
[52] U.S. Cl. .................................. 341/9; 250/231 SE; 341/118
[58] Field of Search ...................... 340/347 D, 347 M; 250/231 SE, 237 G; 371/1, 70

[56] References Cited
U.S. PATENT DOCUMENTS
4,383,317  5/1983  Haville .................................... 371/51

OTHER PUBLICATIONS
The Engineering Staff of Analog Devices, Inc., Analog-Digital Conversion Handbook, 6/1972, pp. II-14 to II-17.

Primary Examiner—T. J. Sloyan
Attorney, Agent, or Firm—S. M. Mitchell; M. J. Meltzer; A. W. Karambelas

[57] ABSTRACT

An improved encoder alignment system is disclosed which provides an indication of the extent of misalignment and a measure of the rate at which the misalignment may be changing. The invention is adapted for use with a conventional encoder which provides a digital coarse word having at least significant bit and a digital fine word having a least significant bit and a most significant bit. The invention generates the exclusive or of the least significant bit of the coarse digital signal and the least significant bit of the fine digital signal to provide a first signal. The invention then generates the exclusive or of the first signal and the complement of the most significant bit of the fine digital signal to provide an output signal which represents the misalignment of the encoder.

8 Claims, 3 Drawing Sheets

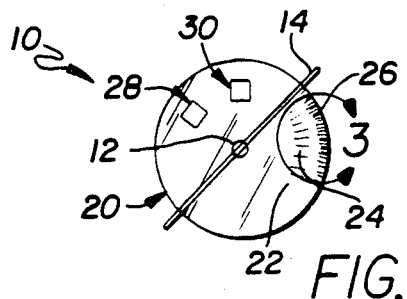
FIG. 2
FIG. 1
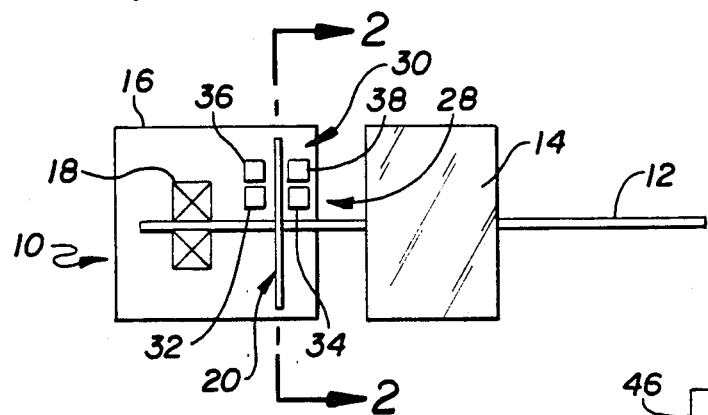
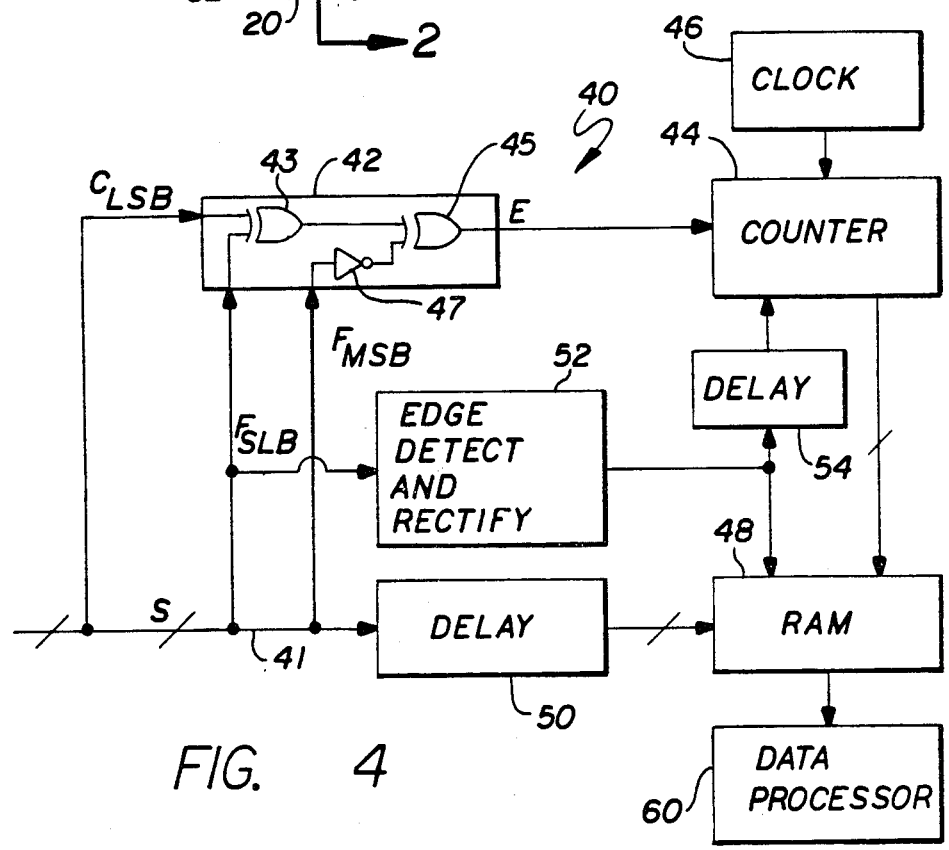
FIG. 4

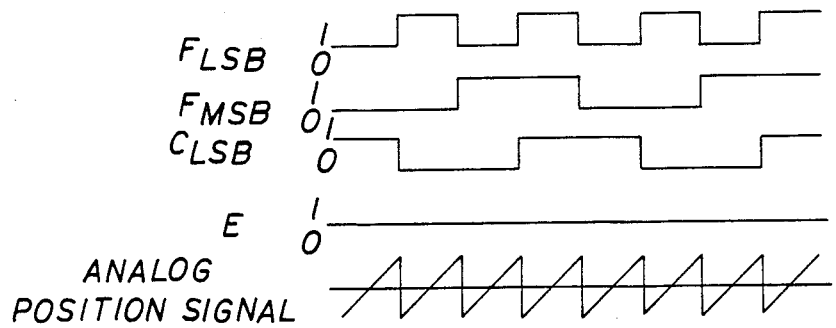
FIG. 5(a)
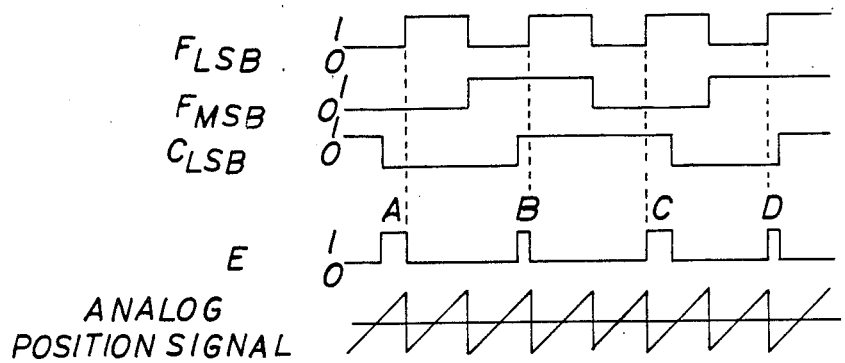
FIG. 5(b)
E
(a) 0/1 ———— PERFECT ALIGNMENT
(b) 0/1 ——⊓—— EARLY $C_{LSB}$ TRANSITION
(c) 0/1 ———⊓— LESS EARLY $C_{LSB}$ TRANSITION
(d) 0/1 ⊓——— LATE $C_{LSB}$ TRANSITION
(e) 0/1 —⊓—— LESS LATE $C_{LSB}$ TRANSITION
FIG. 6

ALIGNMENT SYSTEM FOR ENCODERS

The invention described herein was made in the performance of work under NASA Contract No. NAS 5-24342 and is subject to the provisions of Section 305 of the National Aeronautics and Space Act of 1958 (72 Stat. 435; 42 U.S.C. 2457).

BACKGROUND OF THE INVENTION

1. Field of the Invention:

The present invention relates to encoders used to physically sense the position of optical apparatus and other apparatus. More specifically, the invention relates to systems used to maintain the internal alignment of encoders.

While the present invention is described herein with reference to an illustrative embodiment for a particular application, the invention is not limited thereto. Those having ordinary skill in the art and access to the teachings of the present invention will recognize additional modifications, applications and embodiments within the scope thereof.

2. Description of the Related Art:

The positioning system of a spacecraft scanning mirror is a typical example of the many applications of encoders. Encoders are useful where it is desirable to know, with a high degree of accuracy and certainty, the position of an apparatus mounted for movement about a shaft of pivot. In a typical encoder a transparent disc is mounted on the shaft between a light source and a photodetector. An optical pattern is superimposed on the periphery of the disc between the source and detector. The pattern includes a first set of tracks to provide an indication of the coarse position of the shaft and a second set of tracks to provide an indication of the fine position of the shaft. When the shaft is in motion, the coarse and fine tracks cause the detectors to output bits of a digital word. In a typical system, the least significant bit of the fine track $F_{LSB}$ would change state once per scan drive step. The most significant bit of the fine track and the least significant bit of the coarse track $C_{LSB}$ would change state every two scan steps. By design, the least significant bit of the coarse track $C_{LSB}$ is intended to change state exactly one step out of phase with the most significant bit of the fine track $F_{MSB}$. The coarse and fine numbers are then merged into a single binary number which represents the position of the shaft.

The conventional technique for the merger of the coarse and fine numbers involves the comparison of the least significant bit of the coarse track $C_{LSB}$ to the most significant bit of the fine trace $F_{MSB}$. If $C_{LSB}$ equals $F_{MSB}$, then a value N is set equal to the coarse word C. If $C_{LSB}$ does not equal $F_{MSB}$, the N is set equal to C +1. The combined word S is then determined by discarding the least significant bit of N and appending the fine word F.

The coarse and fine numbers may be so merged so long as the 1 to 0 transitions in $C_{LSB}$ occur within the region where $F_{MSB}$ is zero. If the 1 to 0 transition in $C_{LSB}$ drifts out of this range, an incorrect value may occur in the calculated encoder position represented by the combined word S. The accuracy of the system is thererefore dependent on the degree of misalignment of the coarse and fine tracks. If the misalignment is more than one step of the finest resolution, this conventional technique may break down.

Age, wear and other effects cause substantial misalignment between the coarse and fine photodetectors of practical systems. To avoid the resulting degradation in mirror pointing accuracy and possible lock of the mirror control loop, a second encoder is often provided as a spare. For these and other systems, it is desirable to know the extent of misalignment and the rate at which it is increasing. This would allow for a better understanding of decalibrating effects and for a projection of the useful life of the satellite. Thus, there is a need in the art for a system that provides an indication of the degree of internal misalignment of an encoder.

SUMMARY

The shortcomings of conventional encoder alignment systems are addressed by the improved encoder alignment system of the present invention. The invention provides an indication of the extent of misalignment and a measure of the rate at which the misalignment may be changing. The invention is adapted for use with a conventional encoder which provides a digital coarse word having a least significant bit and a digital fine word having a least significant bit and a most significant bit. The invention generates the exclusive or of the least significant bit of the coarse digital signal and the least significant bit of the fine digital signal to provide a first signal. The invention then generates the exclusive or of the first signal and the complement of the most significant bit of the fine digital signal to provide an output signal which represents the misalignment of the encoder.

BRIEF DESCRIPTION OF THE DRAWINGS

FIG. 1 is a front view of a typical conventional encoder or the related art.

FIG. 2 is a side view of the typical conventional encoder of the related art.

FIG. 4 is a functional block diagram of an illustrative application of the teachings of the present invention.

FIG. 5(a) shows the phase relationships of the coarse and fine track photodetector outputs along with the output of the present invention in an ideal case where there is no misalignment of the photodetectors.

FIG. 5(b) shows the phase relationships of the coarse and fine track photodetector outputs along with the output of the present invention in a typical case where there is misalignment of the photodetectors.

FIG. 6 shows typical output variations of the present invention.

DESCRIPTION OF THE INVENTION

Figure 3:
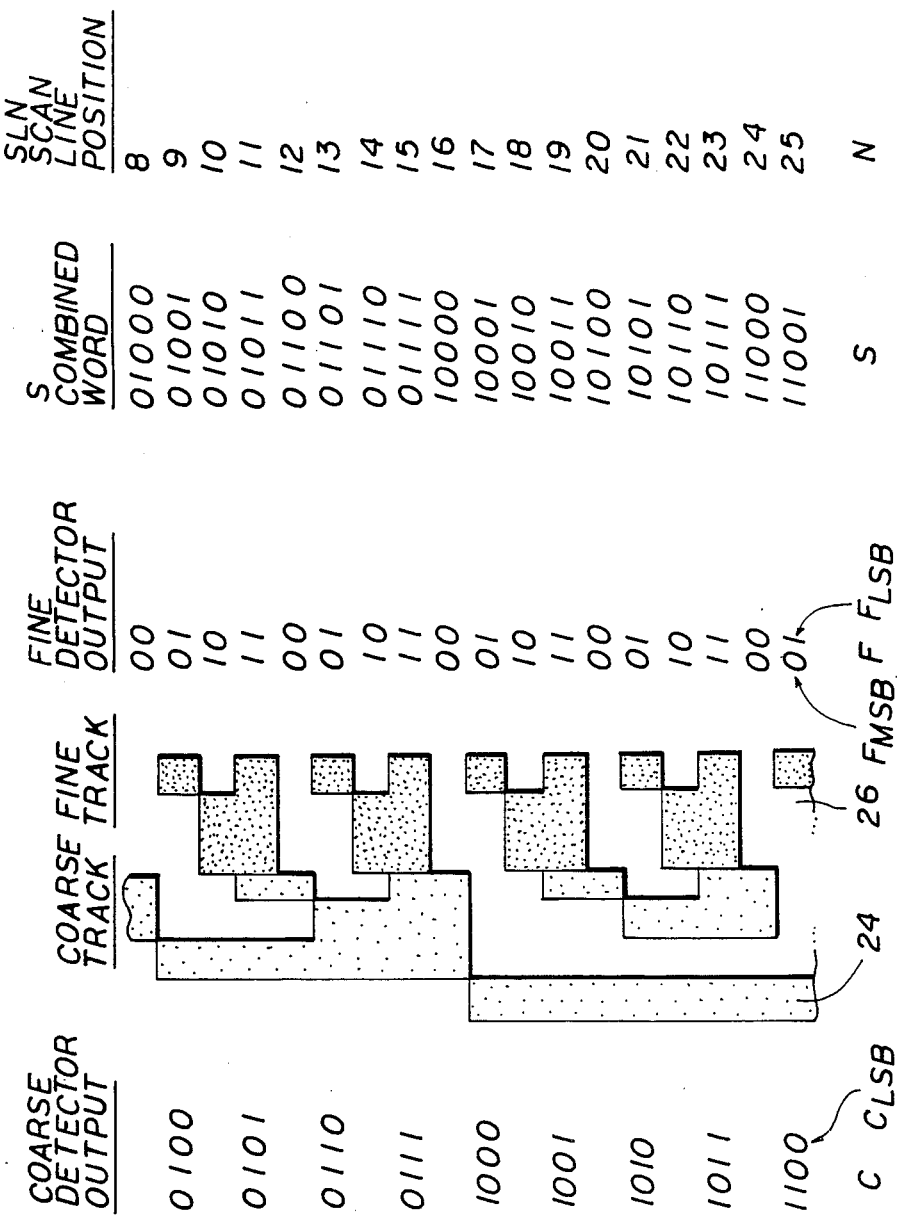
FIG. 3 is an exploded view of a portion of the illumination pattern of the disc of the conventional encoder.

As shown and disclosed herein, the present invention provides an encoder alignment system which provides an indication of the quality of alignment and the rate at which the alignment of misalignment may be changing. The advantages of the invention are secured by selectively 'exclusive or' (XOR) comparing the least significant bit (LSB) of the coarse track with the LSB of the fine track of a conventional digital encoder. The result of the exclusive or comparison of the coarse and fine tracks is XOR compared with the most significant bit (MSB) of the fine track to yield an output signal indicating the quality of alignment.

While the invention may be used with many digital alignment systems, its use with a conventional encoder is typical and illustrative. FIGS. 1 and 2 show front and side schematic views respectively of a typical conventional encoder 10. In FIG. 1, the encoder 10 is mounted on a shaft 12 along with a scan mirror 14. The encoder 10 is encased within a housing 16 along with a motor 18 which drives the shaft 12. In a typical spinning satellite, the clockwise and counter-clockwise rotations of the shaft 12 would drive the scan mirror in the north-south plane while the rotation of the satellite would provide the east-west scan thereof. The encoder 10 typically includes a transparent glass or plastic disc 20 which is mounted on the shaft 12 normal to the mirror 14 and parallel to the plane of motion thereof. As shown in FIG. 2, the disc 20 has a surface pattern 22 of transparent and nontransparent areas. As discussed below, the pattern 22 is magnified in FIG. 3 to show that it includes a coarse track 24 and a fine track 26. As illustrated in FIG. 1, the encoder 10 has a two sets 28 and 30 of light sources and photodectors for the coarse and fine tracks 24 and 26 respectively. The first set 28 includes a light source 32 and a photodetector 34. The second set 30 includes a light source 36 and photodetector 38.

As shown in FIG. 3, the pattern 22 is adapted to provide a unique combination of coarse and fine track outputs from the photodetectors 34 and 38 for each scan line position of the mirror 14. FIG. 3 shows the digital coarse word C corresponding to the coarse track 24, the digital fine word F corresponding to the fine track 26, and the combined word S for each scan line position.

As mentioned above, the least significant bit of the fine track $F_{LSB}$ changes state once per scan drive step. The most significant bit of the fine track changes state every two scan steps as would the coarse track least significant bit $C_{LSB}$. By design, the coarse track least significant bit $C_{LSB}$ is intended to change state exactly one step out of phase with the fine track most significant bit. The coarse and fine numbers are then merged into the single binary number S which represents the scan line position of the shaft 12 and the mirror 14. The conventional technique for merging the coarse and fine numbers involves the comparison of the least significant bit of the coarse track $C_{LSB}$ to the most significant bit of the fine track $F_{MSB}$. If $C_{LSB}$ equals $F_{MSB}$, then a value N is set equal to the coarse word C. If $C_{LSB}$ does not equal $F_{MSB}$, then N is set equal to C +1. The combined word S is then determined by discarding the least significant bit of N and appending the fine word F.

The coarse and fine number may be so merged so long as the 1 to 0 transitions in $C_{LSB}$ occur within the region where $F_{MSB}$ is zero. If the 1 to 0 transition in $C_{LSB}$ drifts out of this range, an incorrect value may occur in the calculated encoder position represented by the combined word S. The accuracy of the system is therefore dependent on the degree of misalignment of the coarse and fine tracks. If the misalignment is more than one step of the finest resolution, this conventional technique may break down.

Age, wear and other effects cause substantial misalignment of practical systems. Conventional alignment techniques involve a viewing of the $C_{LSB}$ transitions on an oscilloscope while the encoder is rotated at a constant speed in a laboratory calibration fixture. This approach is not suitable for use once the encoder is installed and being used, especially in a remote or hostile environment. For such applications, it is generally desirable to know the extent of misalignment and the rate at which it is increasing. This would allow for a better understanding of decalibrating effects and for a projection of the useful life of the data gathering system, e.g. a satellite. This, in turn, would allow for the initiation of long lead time programs necessary to provide replacement systems.

These advantageous features are provided by the improved encoder alignment system 40 of the present invention which is shown in a typical application in FIG. 4. The present invention is useful during encoder assembly, installation, and throughout its period of service. The invention provides an output E which represents the XOR comparison of the LSB of the output of the coarse track photodetector 34 ($C_{LSB}$) to the LSB of the output of the fine track photodetector 38 ($F_{LSB}$) to acquire a first value which is then XOR compared to the complement of the MSB output of the fine track photodetector 38 ($F_{MSB}$). This operation may be represented by the equation:

$$E = F'_{MSB} \text{XOR} (F_{LSB} \text{XOR } C_{LSB}) \tag{1}$$

where $F'_{MSB}$ is the complement of the MSB of the output of the fine track photodetector. As shown in FIG. 4, the XOR operations may be implemented using a simple logic circuit 42 including XOR gates 43 and 45 and an inverter 47. The merged combined scan line numbers S (which include the fine words F) along with the LSB of the unmerged coarse word $C_{LSB}$ are provided on a bus 41. $C_{LSB}$, $F_{MSB}$, and $F_{LSB}$ provide inputs for which the logic circuit 42 produces the value of E which corresponds to the operations of equation 1 above.

As shown in FIG. 5(a), in the ideal case where there is no misalignment the outputs C and F of the coarse and fine track photodetectors 34 and 38 are in phase and E is zero. However, as shown in the typical case of FIG. 5(b), photodetector misalignment will cause the coarse and fine tracks to be out of phase and the logic circuit 42 to output a pulse train for E. The width of the pulses corresponds with the degree of misalignment. The differing widths of the pulses in E at A, B, C, and D indicates that the degree of misalignment will vary with the scan position.

In addition to a digital output, an encoder typically provides an analog position signal which varies from a minimum value to a maximum value as the encoder moves from one edge of a digital scan position to the other. If the encoder were to rotate at a constant or nearly constant speed the analog error signal would have a sawtooth pattern synchronized with the transitions of $F_{LSB}$. See FIGS. 5(a) and 5(b). If the analog position signal were used to drive the x input of an oscilloscope and the E signal used to drive the y output, various alignment states would appear as shown in FIG. 6. Waveform (a) represents the ideal case mentioned above where the photodetectors are perfectly aligned. Waveforms (b) and (c) represent an early $C_{LSB}$ transition relative to the output of the fine track photodetector. Waveform (b) corresponds to pulse A in FIG. 5(b). Waveform (c) represents a later $C_{LSB}$ transition relative to that of waveform (b) and is pulse B in FIG. 5(b). Waveforms (d) and (e) of FIG. 6 correspond to pulses C and D and represent late and less late $C_{LSB}$ transitions respectively. Those of ordinary skill in the art will recognize additional encoding schemes within the scope of the invention.

In the illustrative application of FIG. 4, the E output of the logic circuit 42 is used to enable or trigger a counter 44 which counts pulses for a clock 46 so long as E is high. When E goes low, the counter is disabled and the count is stored as data in a random access memory 48. The data is stored in corresponding addresses provided by the scan line number S via a delay circuit 50. An edge detector 52 is triggered by the fine track LSB to strobe the input of data to the RAM 48 and to clear the counter 44 via a second delay circuit 54. Thus, for each scan line position of the shaft 12 and the mirror 14, a value of the pulse width of E corresponding to the degree of misalignment is stored in the RAM 48.

The output of the RAM is input to a data processor 60. Early transitions of $C_{LSB}$ go into, say, even RAM addresses and late transitions of $C_{LSB}$ go into odd addresses, so the distribution of RAM contents provides the timing information necessary to a determination as to whether any $C_{LSB}$ transition was early or late.

In operation, as the encoder 10 rotated from one scan line number (SLN) to the next, the fine track LSB would change from n to n +1 and trigger the edge detect and rectify circuit 52 to load the contents of the counter 44 into location n in the RAM 48. After a short delay, the counter 44 is reset to zero by the delay circuit 54 and the address input to the RAM 48 changes to n+1. As the encoder 10 continues to rotate, at any time when the output signal E is a logic "1", the counter 44 is gated so that it counts up at the clock rate. The count for the n+1 position is stored at address n +1 and the process continues until the misalignment count for each SLN is stored. The data processor 60, which may be onboard or remote to the system 40, may perform a number of processing operations on the data thus provided depending on the requirements of a particular application as is known in the art. For example, the processor 60 could provide a detailed trend analysis of the overall alignment health as well as the history of the alignment for each scan position. The mean and standard deviation of misalignment for each position as well as the average over all scan lines may be provided given the data provided by the present invention. Maximum misalignment in each direction and the scan line position at which it occurs could be made available by the processor if needed. All SLN's with misalignment above a certain threshold may be indicated. Changes in any of these items since the last measurement may be indicated and variations in these items or parameters may be correlated with respect to temperature, light bulb or LED drive, etc..

Thus, the invention has been described herein with reference to a particular embodiment for an illustrative application. Those having ordinary skill in the art and access to the teachings provided herein will recognize additional modifications, applications and embodiments within the scope thereof. For example, as mentioned above, the invention is not limited to use in encoders. Further, the technique for providing the exclusive or comparisons is not critical to the invention. Further, the invention is not limited to any system by which the data is extracted and used. Nor is the invention limited to the result of any processing scheme. The hardware implementation and the processing scheme employed will be varied by the system designer and/or operator based on the operational requirements of a particular application in a manner well known to those skilled in the art.

It is therefore intended by the appended Claims to cover such modifications, applications and embodiments within the scope of the invention.

Thus,

What is claimed is:

1. An improved alignment system for an encoder having means for generating a coarse digital signal having a least significant bit and means for generating a fine digital signal having a most significant bit and a least significant bit with the two generating means being aligned such that the 1-to-0 state transition of the least significant bit of the coarse digital signal occurs when the most significant bit of the fine digital signal is in the 0 state, the system comprising:
   first means for providing an exclusive or operation on the least significant bit of the coarse digital signal and the least significant bit of the fine digital signal to provide a first signal; and
   second means for providing an exlusive or operation on the first signal and the complement of the most significant bit of the fine digital signal to provide an output signal which represents misalignment of said encoder.

2. The improved alignment system of claim 1 wherein said first means and said second means are provided by a logic circuit.

3. The improved alignment system of claim 2 wherein said logic circuit provides a digital output signal having a train of pulses with the width of each pulse representing the misalignment of said encoder.

4. The improved alignment system of claim 3 including a counter for measuring the width of the output pulses to provide output data.

5. The improved alignment system of claim 4 including means for storing the output data at addresses corresponding the instantaneous position of said encoder.

6. The improved alignment system of claim 5 including data processing means for operating on stored output data.

7. An improved alignment system for a device having means for generating a coarse digital signal having a least significant bit and means for generating a fine digital signal having a most significant bit and a least significant bit with the two generating means being aligned such that the 1-to-0 state transition of the least significant bit of the coarse digital signal occurs when the most significant bit of the fine digital signal is in the 0 state, the system comprising:
   first means for providing an exclusive or operation on the least significant bit of the coarse digital signal and the least significant bit of the fine digital signal to provide a first signal;
   second means for providing an exclusive or operation on the first signal and the complement of the most significant bit of the fine digital signal to provide an output signal which represents misalignment of said device; and
   means for processing the output signal.

8. An improved method for aligning a device having means for generating a coarse digital signal having a least significant bit and means for generating afine digiral signal having a most significant bit and a least significant bit with the two generating means being aligned such that the 1-to-0 state transition of the least significant bit of the coarse digital signal occurs when the most significant bit of the fine digital signal is in the 0 state, the method including the steps of:
   (a) operating on the least significant bit of the coarse digital signal and the least significant bit of the fine digital signal to provide a first signal which is the exclusive or thereof; and
   (b) operating on the first signal and the complement of the most significant bit of the fine digital signal to provide an output signal which is the exclusive or thereof and represents misalignment of said device.

* * * * *